United States Patent
Kapany et al.

(10) Patent No.: US 6,480,513 B1
(45) Date of Patent: Nov. 12, 2002

(54) TUNABLE EXTERNAL CAVITY LASER

(75) Inventors: Narinder S. Kapany, Woodside; Lew Stolpner, Mountain View, both of CA (US)

(73) Assignee: K2 Optronics, Inc., Sunnyvale, CA (US)

( * ) Notice: Subject to any disclaimer, the term of this patent is extended or adjusted under 35 U.S.C. 154(b) by 57 days.

(21) Appl. No.: 09/680,150

(22) Filed: Oct. 3, 2000

(51) Int. Cl.$^7$ .................................................. H01S 3/10
(52) U.S. Cl. ........................ 372/20; 372/34; 372/64; 372/92; 372/6; 372/102
(58) Field of Search ........................... 372/92, 20, 64, 372/34, 6, 102, 96

(56) References Cited

U.S. PATENT DOCUMENTS

| | | | |
|---|---|---|---|
| 4,786,132 A | 11/1988 | Gordon ................... 350/96.19 |
| 5,104,209 A | 4/1992 | Hill et al. ...................... 385/27 |
| 5,151,908 A | 9/1992 | Huber ........................... 372/6 |
| 5,341,391 A | 8/1994 | Ishimura ...................... 372/26 |
| 5,461,687 A | 10/1995 | Brock .......................... 385/37 |
| 5,557,439 A | 9/1996 | Alexander et al. .......... 359/130 |
| 5,684,611 A | 11/1997 | Rakuljic et al. ............... 359/7 |
| 5,706,301 A | * 1/1998 | Lagerstroem ................ 372/32 |
| 5,732,170 A | 3/1998 | Okude et al. ................. 385/27 |
| 5,778,118 A | 7/1998 | Sridhar ........................ 385/24 |
| 5,832,011 A | 11/1998 | Kashyap |
| 5,870,417 A | * 2/1999 | Verdiell et al. ............... 372/32 |
| 5,930,280 A | 7/1999 | Rossi et al. |
| 5,937,120 A | * 8/1999 | Higashi ....................... 372/102 |
| 5,982,791 A | 11/1999 | Sorin et al. .................... 372/25 |
| 5,987,200 A | 11/1999 | Fleming et al. |
| 6,108,470 A | 8/2000 | Jin et al. |
| 6,111,999 A | 8/2000 | Espindola et al. |
| 6,188,705 B1 | 2/2001 | Krainak et al. |
| 6,301,272 B1 | 10/2001 | Koch et al. |

* cited by examiner

Primary Examiner—Leon Scott, Jr.
(74) Attorney, Agent, or Firm—Townsend and Townsend and Crew LLP

(57) ABSTRACT

A tunable laser system comprises an externalcavity laser diode in combination with an optically coupled waveguide having a Bragg grating formed therein. The laser diode provides a gain medium characterized by a first band of wavelengths. A portion of the fiber and the grating help define an external resonant cavity. The grating limits the wavelengths exiting the external cavity to a second band that is typically much narrower than the first band. The grating region of the waveguide is thermally coupled to a heating element having an associated temperature controller for controllably varying the temperature of the grating region and thus changing the optical pitch of the grating and thus the second band. The grating region of the waveguide can alternatively, or additionally, be subjected to acoustic energy to change the optical pitch of the grating.

24 Claims, 3 Drawing Sheets

TUNABLE EXTERNAL CAVITY LASER

BACKGROUND OF THE INVENTION

The invention relates generally to semiconductor lasers (laser diodes), and more specifically to techniques for varying the wavelength of such lasers in connection with use in fiber optic communications systems.

It is well established that multiple optical communications channels can be optically multiplexed onto a single optical fiber by a technique known as wavelength division multiplexing (WDM). Multiple lasers, each at a different wavelength from the others, are modulated in accordance with respective information patterns, and the modulated light from each laser is output on a respective fiber segment. The light from all the fiber segments is combined onto a single fiber by a wavelength division multiplexer. Light at the other end of the single fiber is separated onto individual fiber segments by a wavelength division demultiplexer, and the light on the individual fiber segments is demodulated to recover the original information patterns.

As the demand for bandwidth has exploded, due in large part to the growth of the Internet and data communications, additional demands are made on the fiber optic technology. A relatively new technology, called dense wavelength division multiplexing (DWDM), is being deployed to expand the capacity of new and existing optical fiber systems. The improvements include providing more wavelength channels, and where possible, increasing the bit rate on each channel.

As is well known, typical single-mode fiber optics communications are at wavelengths in the 1300-nm and 1550-nm ranges. The International Telecommunications Union (ITU) has defined a standard wavelength grid having a frequency band centered at 193,100 GHz, and other bands spaced at 100 GHz intervals around 193,100 GHz. This corresponds to a wavelength spacing of approximately 0.8 nm around a center wavelength of approximately 1550 nm, it being understood that the grid is uniform in frequency and only approximately uniform in wavelength. Implementations at other grid spacings (e.g., 25 GHz, 50 GHz, 200 GHz, etc.) are also permitted.

Since a given fiber in a communications system may need to carry as many as 80 closely spaced wavelengths, it will be appreciated that this translates to a need to provide lasers at all the needed wavelengths. As the bit rates increase and the wavelength channels become more closely spaced, crosstalk becomes an increasing problem. Thus the need to control the lasers' output wavelengths has become more critical.

SUMMARY OF THE INVENTION

The present invention provides flexible and cost-effective optical sources suitable for use in the demanding environment of WDM and DWDM communications. The sources are easily configured for a variety of applications.

In short, an optical source in accordance with one aspect of the invention includes a laser device configured to emit light over a first band of wavelengths, and a waveguide positioned to receive light emitted by the laser device. The waveguide is formed with a grating, and a portion of the waveguide and the grating at least partially define an external cavity. The grating limits light exiting the external cavity in a particular direction (normally away from the laser device) to a second band of wavelengths that is narrower than, and contained within the first band of wavelengths. In particular embodiments, the first band of wavelengths is defined by a semiconductor laser's optical amplification (SOA) gain spectrum peak while the second band of wavelengths is defined by the grating peak. The grating peak can be one or two orders of magnitude narrower than the SOA gain peak.

The location of the second band of wavelengths depends on a set of one or more properties of the waveguide and grating, and a mechanism is provided for controllably changing at least one of the set of properties so as to change the location of the second band of wavelengths accordingly. This provides a tuning range for the second band, which tuning range can be comparable to the width of the first band of wavelengths.

The set of one or more properties may include the grating's geometric pitch and/or the waveguide's refractive index in the vicinity of the grating. The refractive index can be controlled by heating or cooling the grating, or applying tensile or compressive stress to the grating. These also have a direct effect on the grating pitch, but to a significantly lesser extent. The temperature control can be effected by direct contact with a heater element or by radiative heating. Active cooling can be effected through direct contact with a cooling element such as a thermoelectric cooler (TEC). Stress can be applied statically, such as by anchoring the waveguide at two spaced points to a substrate material having a purposely different thermal expansion coefficient, and then heating at least the substrate. The stress can also be induced acoustically where the waveguide is positioned at the node of an acoustic cavity.

Accordingly, the mechanism, depending on the embodiment, may include a temperature control element thermally coupled to the waveguide in the vicinity of the grating or to the substrate material, or an acoustic actuator acoustically coupled to the waveguide in the vicinity of the grating. Moreover, if the portion of the waveguide that contains the grating is formed of an electro-optic material, the mechanism can be a voltage generator applied to electrodes formed on or near the electro-optic portion of the waveguide.

The grating itself can be a permanent structure or a tunable acousto-optical filter (where periodic changes in refractive index are induced by an acoustic standing wave with nodes spaced along the optical axis). Additionally, the waveguide can be formed of two or more different materials, with the grating formed in a region of one of the materials.

A further understanding of the nature and advantages of the present invention may be realized by reference to the remaining portions of the specification and the drawings.

DESCRIPTION OF THE SPECIFIC EMBODIMENTS

Thermally Tunable Laser Assembly

Figure 1:
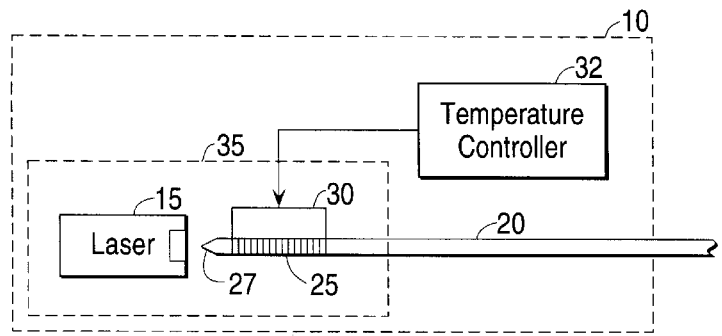
FIG. 1 is a schematic plan view of a single-laser embodiment of the invention using thermal tuning.

FIG. 1A is a schematic plan view of a tunable laser system 10 according to an embodiment of the invention. The tunable laser system comprises an external-cavity laser diode 15 in combination with an optically coupled fiber 20 having a Bragg grating 25 formed therein. The laser diode provides a gain medium characterized by a certain band of wavelengths (sometimes referred to as the first band). A portion of the fiber and the grating help define an external resonant cavity. The grating limits the wavelengths exiting the external cavity to a second band that is typically much narrower than the first band. The second band is sometimes referred to as the output wavelength, it being understood that the output is in fact an even narrower band (cavity mode) located within this second band. The fiber is formed with a tapered end 27, spaced from the laser diode's emitting facet, to increase the efficiency of the optical coupling. This is a known technique, and will not be discussed further.

The grating region of the fiber is thermally coupled to a heating element having an associated temperature controller 32 for controllably varying the temperature of the grating region. The heating element could be replaced or augmented by a thermoelectric cooling (TEC) element to provide a larger range of temperature control.

The grating is typically defined by a set of plane parallel index perturbations, which may be generated by short-wave (UV) exposure of a pre-sensitized fiber by holographic or phase-mask techniques. Pre-sensitized fiber is typically provided with enhanced doping in the core, with the core made correspondingly smaller in diameter to maintain single-mode operation. Thus, the grating is formed predominantly in the core of the fiber. This technology of forming fiber gratings highly evolved and photosensitive fiber having suitable characteristics is commercially available from such vendors as Lucent and Corning. Thus the fabrication of the grating within the fiber core will not be described in further detail. While the grating may be formed with a permanent pattern, the grating can be implemented as a tunable acousto-optical filter. In such a device, periodic changes in refractive index are induced by an acoustic standing wave with nodes spaced along the optical axis.

The specifics of packaging are not part of the invention, but for definiteness, laser diode 15, grating 25, and heating element 30 are shown as being components of a packaged laser subassembly 35. Temperature controller 32 is shown as outside the packaged laser assembly. Other circuitry, such as the laser diode driving circuit (typically commercially available as an integrated circuit from vendors such as Maxim Integrated Products or SONY Electronics), is well known to those skilled in the art, and is not shown or described. Such circuitry is also typically located outside the packaged laser subassembly. Power monitoring circuitry can likewise be located outside the package, but a monitor photodiode or the like would most likely be located inside the package.

The output wavelength depends on the optical pitch of the grating, which depends on the geometric pitch of the grating and the refractive index of the fiber in the grating region. The geometric pitch and refractive index vary with temperature in accordance with the thermal and material characteristics of the fiber. Thus, controllably varying the temperature of the fiber in the region of the grating causes controlled variation of the geometric pitch and refractive index of the fiber, which causes controlled variation of the output wavelength. For most fiber materials, the change in the refractive index as a function of temperature tends to be larger than the change of geometric pitch as a function of temperature. That is, most of the change of optical pitch arises from the change in the refractive index of the fiber material.

Figure 2:
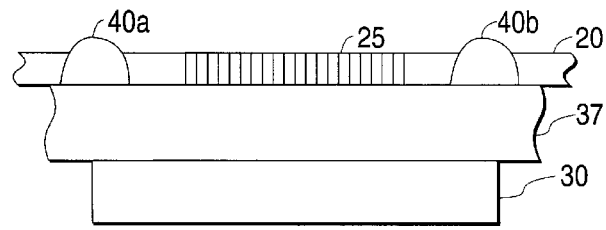
FIG. 2 is a schematic showing the waveguide bonded to a substrate at two points spanning the grating to effect temperature-induced stress.

FIG. 2 is a schematic showing a particular way of effecting wavelength tuning by temperature control. While FIG. 1 as illustrated and described implies direct heating of the waveguide to change the refractive index, a wider range of wavelength tuning can be achieved by applying thermally-induced stress. FIG. 2 shows fiber 20 bonded to a substrate 37 at two longitudinally spaced points at opposite ends of grating 25. The fiber and the substrate are preferably metallized, and the bonding is effected by soldering the fiber to the substrate at the two locations. The bonds are illustrated as solder blobs 40a and 40b.

The substrate is a material chosen to have a significantly different thermal expansion coefficient than that of the fiber. Heating element 30 is shown applied to the substrate, but the result is to heat the substrate and the fiber. Due to the difference in the thermal expansion coefficients, changes in temperature subject the fiber to longitudinal stress in the grating region, thereby changing the refractive index. This stress-induced change in refractive index tends to be significantly greater than the change due to the temperature change. Therefore, it is not necessary that the stress-induced and temperature-dependent changes in refractive index have the same sign. Rather, the substrate material can be selected to meet any other design criteria such as reliability or cost.

Laser diode 15 is itself temperature stabilized with one or more stages of cooling. For example, a TEC (not shown) may be coupled between the laser diode chip and the package of assembly 35 to provide a first stage of active cooling. A second stage of cooling may be provided outside the package, which stage can be active (e.g., another TEC) or passive (e.g., a finned heat sink with or without a fan). Temperature stabilization is a known technique, and will not be described further.

Wavelength monitoring is carried out according to any known convenient technique. A tap coupler could be inserted into the output fiber, and a small fraction of the light communicated to wavelength monitoring apparatus such as a coupler, Fabry-Perot interferometer, or a grating-based spectral analyzer. This type of monitoring is not necessary to the operation of the invention, and will not be described further.

Acoustically Tunable Laser Assembly

Figure 3:
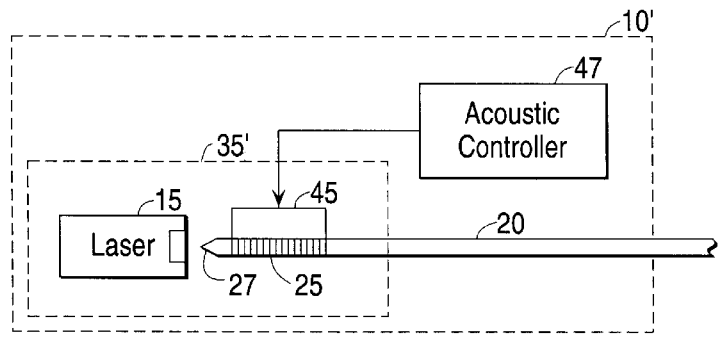
FIG. 3 is a schematic plan view of a single-laser embodiment of the invention using acoustic tuning.

FIG. 3 is a schematic plan view of a tunable laser assembly 10' according to another embodiment of the invention. The tunable laser assembly of this embodiment includes the laser diode, the fiber, and the grating, but differs from the embodiment of FIG. 1 in that tuning is accomplished by applying acoustic energy to the fiber in the region of the grating. Thus, the grating region of the fiber is acoustically coupled to an acoustical transducer 45 having an associated acoustical controller 47.

As mentioned above, output wavelength depends on the optical pitch of the grating, which depends on the geometric pitch of the grating and the refractive index of the fiber in the grating region. Applying acoustical energy to the fiber changes the refractive index of the fiber material, and thus changes the optical pitch. The application of acoustical energy can be combined with the heating/cooling technique shown in FIG. 1 to provide an even larger range of wavelength control.

Figure 4A:
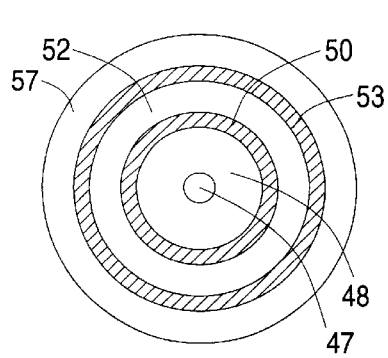
FIGS. 4A and 4B are schematic sectional views showing the waveguide located at the node of an acoustic standing wave.
Figure 4B:
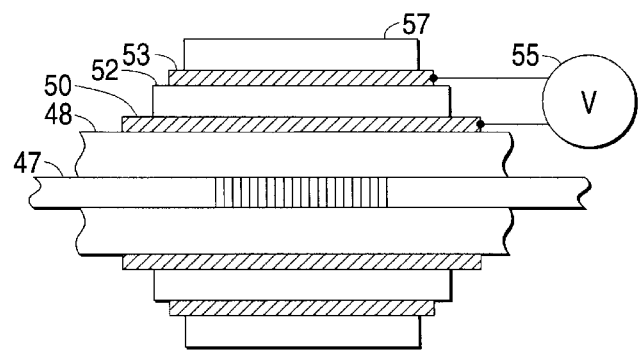

FIGS. 4A and 4B are schematic transverse and longitudinal sectional views showing a particular structure that generates an acoustic standing wave with the fiber core (i.e., the grating portion of the waveguide) located at the node of the acoustic standing wave. In particular, the fiber is shown as having a core 47 and a cladding 48, with a metal layer 50 deposited on the outside of the fiber, at least in the region of the grating. A layer 52 of acousto-electric material, such as zinc oxide, is formed coaxially on the metallized fiber, and a layer 53 of metal is formed on layer 52. A voltage generator 55 is coupled to the two metal layers, thereby setting up acoustic waves in acousto-electric layer 52. A body 57 of material is formed coaxially on metal layer 53 to provide acoustic impedance matching so that the structure shown defines a resonant acoustic cavity. An acoustic standing wave is generated with its node at the core of the fiber. Controlling the refractive index of the fiber core is effected by controlling the voltage applied by voltage generator 55.

Laser and Grating Characteristics and Parameters

To function as an external-cavity laser, the laser diode chip is provided with an anti-reflective (AR) coating on its emitting facet and a highly reflective coating (say 95%) on its opposite facet. In passing it is noted that once the chip has the AR coating, it is no longer capable of operating as a laser without the external cavity. Rather, it is a super luminescent diode. Another way to prevent reflection of the light from the emitting facet back into the chip is to use a laser chip with a curved waveguide. The invention is not limited to any specific type of external cavity laser. For example, suitable types of laser diodes include edge-emitting lasers with InP-based and InP/InGaAsP-based structures. Fabry-Perot devices (with standard or expanded spot sizes) are suitable. An expanded beam laser chip is formed with an internal waveguide that is adiabatically flared so that it is significantly broadened at the emitting facet.

The laser chip may be of a two-section design where one section is used for the gain and the other for fine phase tuning to optimize the cavity mode position within the spectrum of the grating (i.e., locate it close to the peak).

The semiconductor optical amplification (SOA) gain spectrum of the laser diode devices is generally characterized by a peak having a typical width (full width at half maximum, or FWHM) on the order of 10–20 nm. The Bragg grating is characterized with a reflection spectrum that has peaks that are significantly narrower than the SOA gain peak, for example, on the order of 0.1–0.2 nm (FWHM). The zero-order and first-order grating peaks have a separation that is generally on the order of the width of the SOA gain spectrum. Thus, it is possible to control the output wavelength by shifting the grating peaks over a range such that the first-order grating peak remains within the SOA gain peak and the second-order grating peak remains outside the SOA gain peak. Note that suitable apodization of fiber gratings can suppress side lobes (second-order peak).

As briefly mentioned above, the fiber grating defines the external cavity. Therefore, the laser chip's internal cavity and the fiber grating together define the laser cavity. The effective length of the cavity is the distance between the reflecting (rear) facet and a location approximately half-way along the grating. The grating is preferably on the order of 5–15 mm in length along the optical axis with an overall cavity length on the order of 4–8 mm. In general, the grating bandwidth is inversely proportional to the grating length. For the wavelengths of interest, a grating length of 5 mm results in a grating bandwidth (FWHM) on the order of 0.2 nm. The longitudinal cavity mode spacing is also on this order, and therefore the grating can be designed to limit the output to a single mode. The cavity mode linewidth is on the order of 10–50 MHz (three orders of magnitude narrower than the grating bandwidth).

Tunable Laser Arrays

Figure 5:
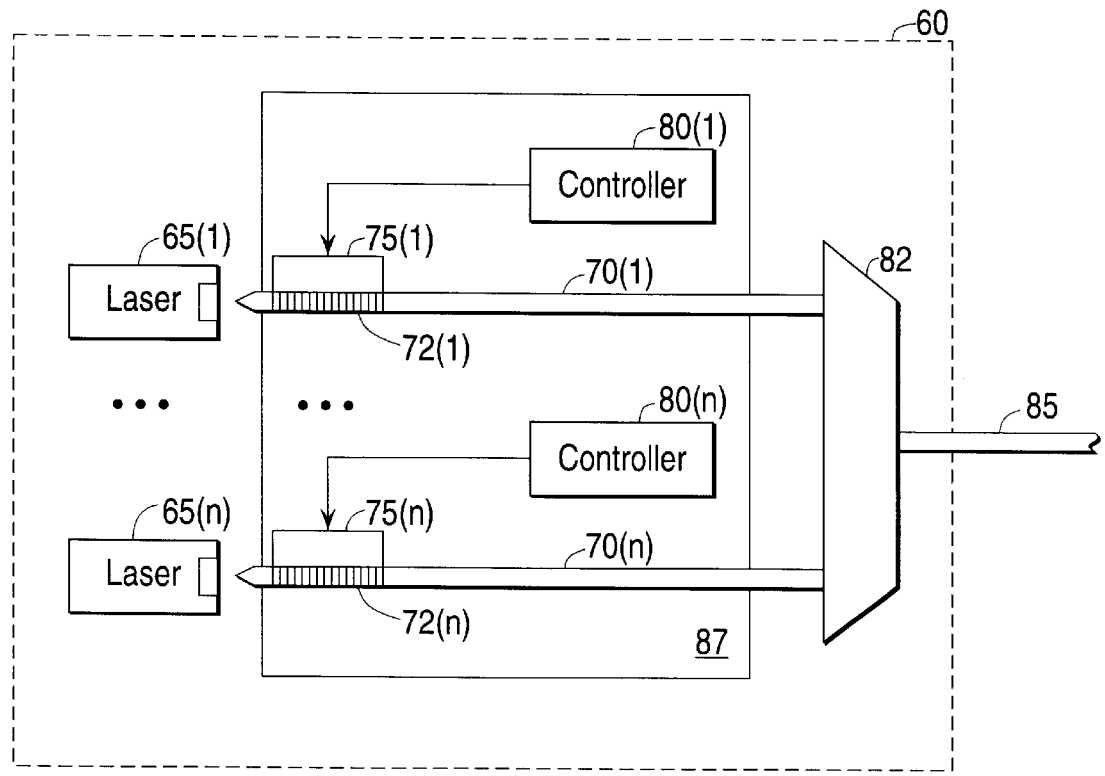
FIG. 5 is a schematic plan view of a multiple-laser embodiment using a fiber array.

FIG. 5 is a schematic plan view of a tunable laser array 60 according to an embodiment of the invention. This array includes a plurality of lasers 65(1 . . . n); in a typical implementation, n might be 4 or 8. The lasers may be individual devices, but are preferably formed on a single substrate. The lasers are interfaced to the tapered ends of a corresponding plurality of fibers 70(1 . . . n), formed with respective gratings 72(1 . . . n). Wavelength control of the individual lasers is effected using one or both of thermal and acoustic energy as discussed above. The grating regions of the fibers are shown with generic transducers 75(1 . . . n), each of which may include one or more of a heating element, a cooling element, and an acoustical transducer. The transducers are shown as having associated controllers 80(1 . . . n). These may be individual devices or may be monolithically formed. The fibers are connected to the inputs of a wavelength multiplexer 82 having a single output fiber 85.

In a typical embodiment, the fibers are mounted to a silicon substrate 87 in which V-grooves had been formed by lithographic processes, and the fiber ends are bonded into the V-grooves. This could be accomplished, for example, by metallizing the fibers and the V-grooves and soldering the metallized fibers in the metallized V-grooves. The substrate is shown in a highly schematic form.

Figure 6:
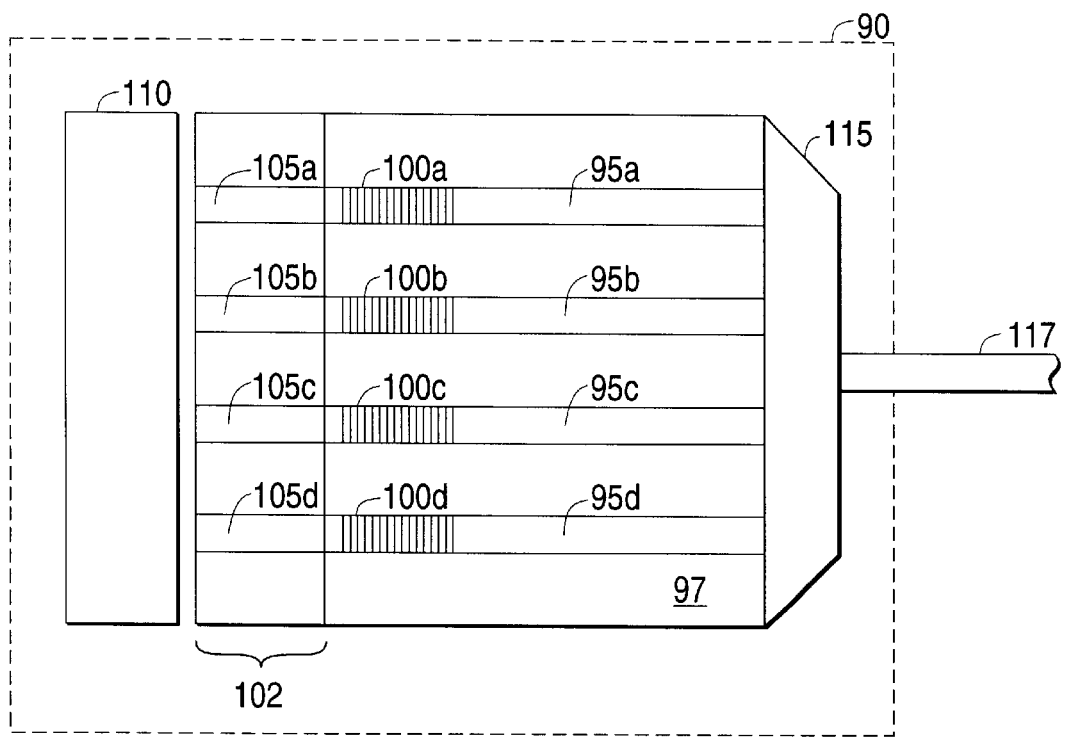
FIG. 6 is a schematic plan view of a multiple-laser embodiment using a planar waveguide array.

FIG. 6 is a schematic plan view of a tunable laser array 90 according to another embodiment of the invention. For simplicity, the transducers and controllers are not shown. In this embodiment, fibers 70(1 . . . n) are replaced by planar waveguides 95a–95d formed in a planar waveguide structure 97 (in this particular example, n=4 and all four waveguides are shown). Respective gratings 100a–100d are formed in the waveguide structures. A laser diode array 102 having individual laser diodes 105a–100d is optically coupled to the waveguide structure. Laser diode array 102 is preferably a single chip containing four expanded beam laser diodes, although individual laser diode chips may be used. The laser diodes are preferably coupled directly to the waveguides using index matching cement (this is referred to in the industry as butt coupling) to achieve optical contact. It is preferred to use a large-spot-size (expanded beam) laser in conjunction with planar waveguides to maximize the light transfer into the waveguide (since the technique of using a tapered fiber end to enhance coupling is not applicable).

A monitor photodiode 110 is preferably disposed on a side of the laser array remote from the waveguide structure, and can be used to provide a power monitor signal. To provide the monitoring capability, the rear facet, which needs to be reflecting can be made partially transmissive to allow some of the light to leak out. The waveguides are connected to the inputs of a wavelength multiplexer 115 having a single output fiber 117.

The planar waveguide structure can be manufactured in accordance with known technologies. For example, a typical construction has a layer of silicon dioxide (silica) formed on a silicon substrate. Regions of the silica corresponding to desired waveguides are doped to provide an increased refractive index relative to the remaining portions of the silica. This can be accomplished by known planar germanium-doped silica waveguide processing techniques for creating buried structures. Gratings 100a–100d are preferably formed in the waveguide structures in a lithographic process.

It is also known to make planar waveguides out of a polymer material on a silicon substrate. The polymer material can be designed to have a refractive index whose temperature-dependence is significantly greater than that of silica. Thus polymer waveguides have the potential of providing a wider range of wavelength tuning for a given range of temperatures.

If the waveguide is made of an electro-optic material (such as lithium niobate, lithium tantalate, or poled nonlinear organic molecules in a polymer host) at least in the grating region, tuning can be effected by applying a controlled voltage across the waveguide. The use of electro-optic tuning can be a standalone technique, or can be combined with one of the thermal and acoustic techniques described above.

Applications of Tunable Laser Arrays

The discussion of the laser arrays above assumed that each laser was individually tunable by virtue of the replication of the structures described in connection with the single-laser assemblies shown in FIGS. 1 and 3. Such is the case, but the arrays can be configured for different applications by configuring the lasers and the gratings in different particular ways. For one set of applications, all the lasers in the array are configured with generally the same SOA gain spectrum, and the gratings are configured with different pitches for the same temperature. The grating peak locations can thus be determined to fall at different locations within the SOA gain peak, and tuned over lesser ranges using the thermal, acoustic, or electro-optic control discussed above. Within this general context, it is possible to provide a sufficiently broad range of tuning for the grating peaks so that if one of the lasers in the array fails, another one of the lasers can be used as a backup. In this situation, at least one grating in the array would be tuned over a larger range during this backup operation. Indeed, if one or a small subset of the lasers in the array are dedicated to the backup function, these lasers could be provided with broader tuning ranges than the others, as for example by providing those lasers with somewhat larger heaters for those laser's gratings.

Another possible configuration would have lasers with overlapping, but different, SOA gain peaks, with each grating tunable over a portion of its respective laser's gain peak. By having the ranges for tuning the gratings generally abutting each other, it is possible to provide the functionality of a single laser with a broad tuning range. In this configuration, only one laser would be enabled, and the thermal or acoustic energy need only be applied to that laser's grating.

Figure 7:
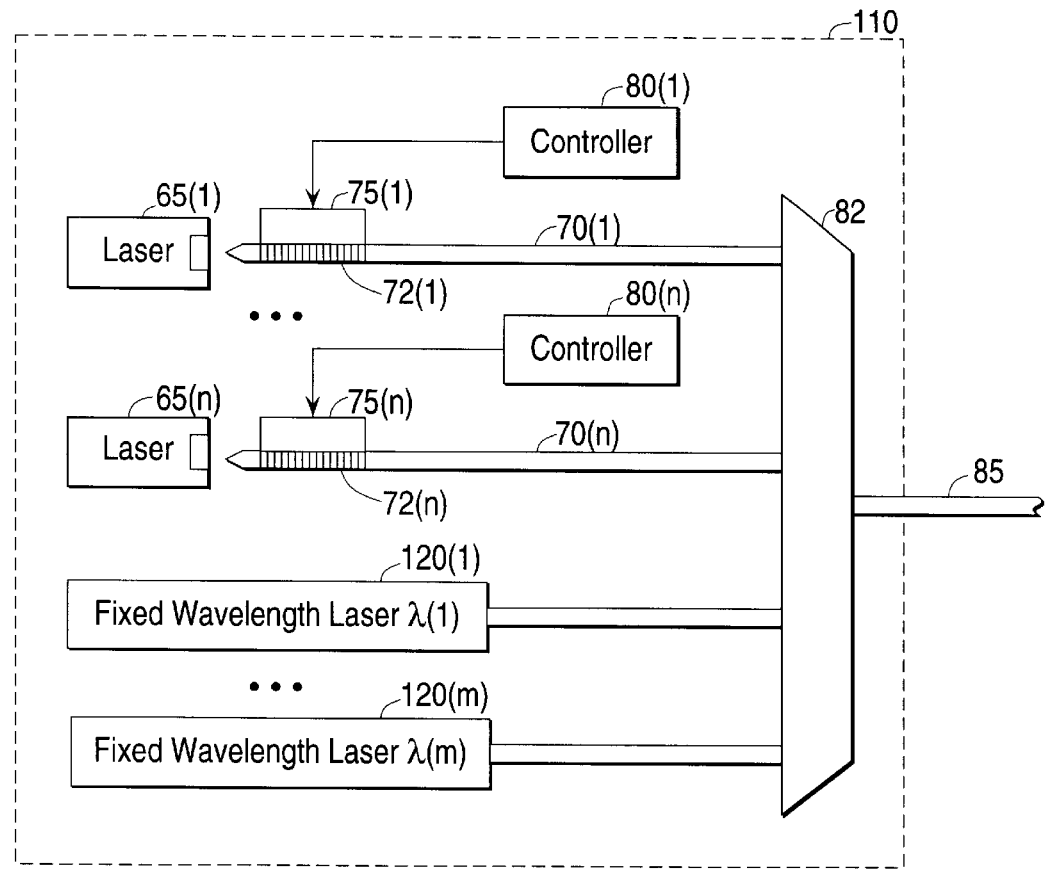
FIG. 7 is a schematic plan view of a multiple-laser embodiment that includes fixed-wavelength lasers in addition to tunable lasers.

FIG. 7 is a schematic plan view of a laser array 110 that incorporates the tunable laser technique in a system with multiple fixed wavelength lasers. For specificity, a construction along the lines of laser array 60, is illustrated, and corresponding elements are denoted with corresponding reference numerals. This embodiment includes, as above, the plurality of lasers 65(1 . . . n), fibers 70(1 . . . n), gratings 72(1 . . . n), transducers 75(1 . . . n), and controllers 80(1 . . . n). The embodiment further includes a plurality of fixed-wavelength lasers 120(1 . . . m) operating at wavelengths designated λ(1 . . . m). One use of this configuration is to have the fixed wavelength lasers used in normal operation, and the unable lasers used to back up the fixed-wavelength lasers. In such a case, the number (n) of tunable lasers will be smaller than the number (m) of fixed-wavelength lasers. When one of the fixed-wavelength lasers fails or is otherwise taken out of operation, the electrical signal that was used to modulate the failed laser is used to modulate the tunable laser that is tuned to the wavelength of the failed laser.

Figure 8:
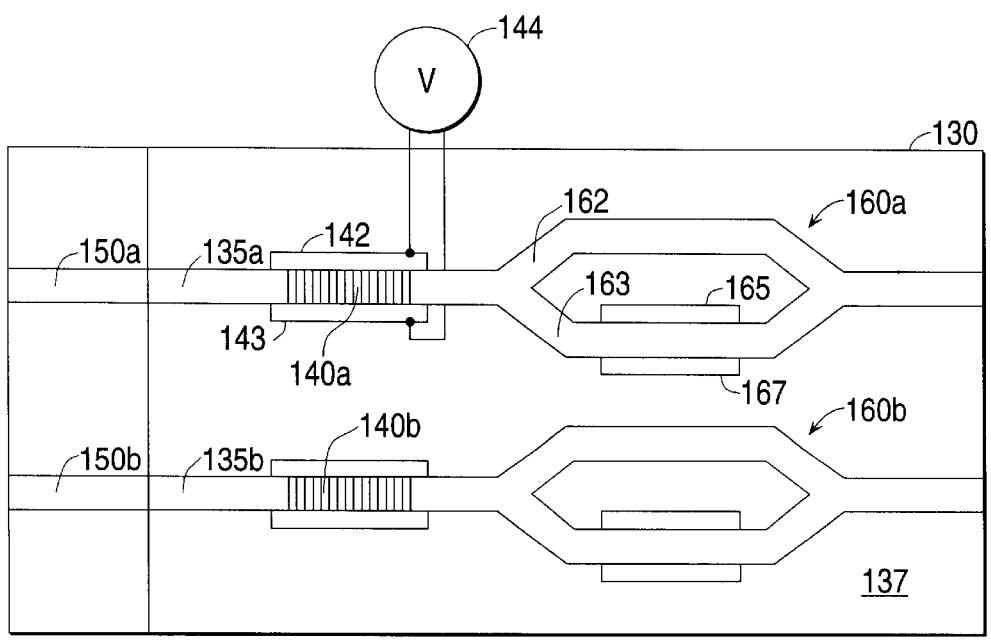
FIG. 8 is a schematic plan view of an embodiment using electro-optic tuning in conjunction with a Mach-Zender modulator.

FIG. 8 is a schematic plan view of an embodiment of a laser array 130 using planar waveguide structures with electro-optic tuning. Only two lasers are shown, but single laser assemblies or larger arrays are possible. Generally, this embodiment may be based on similar technology to that embodied in laser array 90 of FIG. 6, but depends on having an electro-optic waveguide material. Thus planar waveguides 135*a* and 135*b* are formed in a planar waveguide structure 137, and respective gratings 140*a* and 140*b* are formed in the waveguide structures. Since the waveguide material is electro-optic, wavelength tuning of each laser is effected by applying a voltage across a pair of electrodes 142 and 143 disposed on each side the waveguide. This establishes an electric field in the waveguide and changes the waveguide's refractive index (and hence the grating's optical pitch). Only one of the voltage generators, designated 144, is shown. A laser diode array 145 having individual laser diodes 150*a* and 150*b* is optically coupled to the waveguide structure.

This embodiment exploits an advantage of having electro-optic waveguides in that other electro-optic devices can be fabricated on the same substrate. In particular, the lasers are provided with respective Mach-Zender interferometers 160*a* and 160*b* that are configured to act as high-speed modulators. As is well known a Mach-Zender interferometer has two optical arms 162 and 163, and selective delay is introduced into one of the arms to provide a selective blocking action. In particular, a pair of electrodes 165 and 167 are disposed on each side of the waveguide in optical arm 163. For simplicity, the voltage generators are not shown.

Conclusion

In conclusion, it can be seen that the present invention provides effective and versatile techniques for controllably varying the output wavelength of a laser. While the above is a complete description of specific embodiments of the invention, various modifications, alternative constructions, and equivalents may be used. For example, the waveguide can be formed of two or more different materials, with the grating formed in a region of one of the materials. Moreover, it should be understood that features described in connection with any particular embodiment are typically applicable to at least some of the other embodiments. Accordingly, features can be combined with each other or, in appropriate instances, be substituted for each other.

Therefore, the above description should not be taken as limiting the scope of the invention as defined by the claims.

What is claimed is:

1. A tunable optical source comprising:

a laser device configured to emit light over a first band of wavelengths;

a waveguide positioned to receive light emitted by said laser device;

a grating formed within and extending along at least a portion of said waveguide;

a portion of said waveguide and said grating at least partially defining an external cavity with said grating limiting light exiting said external cavity in a particular direction to a second band of wavelengths that is narrower than, and contained within the first band of wavelengths;

said second band of wavelengths depending on a set of one or more properties of said grating and said waveguide; and a mechanism for controllably changing at least one property in said set so as to change the location of said second band of wavelengths in accordance with said change in said at least one property.

2. The tunable optical source of claim 1 wherein:
said at least one property is geometric pitch of said grating;
said waveguide is formed of a material whose dimensions vary as a function of temperature; and
said mechanism includes a temperature control element thermally coupled to said waveguide in the vicinity of said grating.

3. The tunable optical source of claim 1 wherein:
said at least one property is refractive index of said waveguide in the vicinity of said grating;
said waveguide is formed of a material whose refractive index varies as a function of temperature; and
said mechanism includes a temperature control element thermally coupled to said waveguide in the vicinity of said grating.

4. The tunable optical source of claim 1, further including a substrate, wherein:
said at least one property is refractive index of said waveguide in the vicinity of said grating;
said waveguide is an optical fiber;
said optical fiber is anchored to said substrate at longitudinally spaced locations on opposite ends of said grating;
said optical fiber and said substrate have purposely different thermal expansion coefficients; and
said mechanism includes a temperature control element thermally coupled to said substrate in the vicinity of said grating.

5. The tunable optical source of claim 1 wherein:
said at least one property is refractive index of said waveguide in the vicinity of said grating;
at least a portion of said waveguide in the region of said grating is formed of an electro-optic material; and
said mechanism includes a voltage source and electrodes disposed so as to generate an electric field in said electro-optic material and thus change the refractive index of said waveguide in the vicinity of said grating.

6. The tunable optical source of claim 1 wherein:
said at least one property is refractive index of said waveguide in the vicinity of said grating; and
said mechanism includes an acoustic actuator acoustically coupled to said waveguide in the vicinity of said grating.

7. The tunable optical source of claim 6 wherein said acoustic actuator comprises:
a body of acousto-electric material surrounding said waveguide in the vicinity of said grating; and
a voltage generator and electrodes disposed so as to subject said body of acousto-electric material to an electric field so as to generate an acoustic standing wave with a node proximate said grating.

8. The tunable optical source of claim 1 wherein:
said laser device is a semiconductor device having an emitting facet; and
said waveguide is an optical fiber formed with a conical end spaced from said emitting facet.

9. The tunable optical source of claim 1 wherein:
said laser device is a semiconductor device having an emitting facet; and
said waveguide is a planar waveguide in optical contact with said emitting facet.

10. The tunable optical source of claim 9 wherein said laser device is an expanded beam device.

11. A tunable laser array having a plurality of laser assemblies, each assembly comprising:
a laser device configured to emit light over a respective first band of wavelengths;
a waveguide positioned to receive light emitted by that assembly's laser device;
a grating extending along that assembly's waveguide;
a portion of that assembly's waveguide and that assembly's grating at least partially defining an external cavity with that assembly's grating limiting light exiting that assembly's external cavity in a particular direction to a second band of wavelengths that is smaller than, and contained within that assembly's first band of wavelengths;
that assembly's second band of wavelengths depending on a set of one or more properties of that assembly's grating and waveguide; and
a mechanism for controllably changing at least one property in that assembly's set so as to change the location of that assembly's second band of wavelengths in accordance with said change in said at least one property to provide a wavelength tuning range for that assembly.

12. The tunable laser array of claim 11, and further comprising a wavelength multiplexing device for combining light from the plurality of laser assemblies and directing the light, so combined along a common optical path.

13. The tunable laser array of claim 11 wherein:
said first wavelength bands are nominally the same for said plurality of assemblies;
said gratings for said plurality of assemblies have different geometric pitches;
said mechanism for at least a particular one of said assemblies is configured to controllably change said at least one property in the particular assembly's set so that the particular assembly's second band of wavelengths can be made to overlap a particular other assembly's second band of wavelengths; and
the particular one of said assembly's laser device is only energized when the particular other assembly's laser device is not energized.

14. The tunable laser array of claim 11 wherein:
said first wavelength bands are different but overlapping for said plurality of assemblies, such that said laser devices collectively are configured to emit light over a third band that is broader than any of the first bands;
said tuning ranges are different but abutting or overlapping; and
only a single assembly's laser is energized at a particular time, whereby the tunable laser array provides the functionality of a single tunable laser with a broad tuning range that exceeds the width of any assembly's laser's first band of wavelengths.

15. The tunable laser array of claim 11 wherein at least one of said assemblies has a broader tuning range than another one of said assemblies.

16. The tunable laser array of claim 11 wherein, for at least one of said assemblies:
said at least one property is geometric pitch of said grating;
said waveguide is formed of a material whose dimensions vary as a function of temperature; and
said mechanism includes a temperature control element thermally coupled to said waveguide in the vicinity of said grating.

17. The tunable laser array of claim 11 wherein, for at least one of said assemblies:
- said at least one property is refractive index of said waveguide in the vicinity of said grating;
- said waveguide is formed of a material whose refractive index varies as a function of temperature; and
- said mechanism includes a temperature control element thermally coupled to said waveguide in the vicinity of said grating.

18. The tunable laser array of claim 11, further including a substrate, and wherein, for at least one of said assemblies:
- said at least one property is refractive index of said waveguide in the vicinity of said grating;
- said waveguide is an optical fiber;
- said optical fiber is anchored to said substrate at longitudinally spaced locations on opposite ends of said grating;
- said optical fiber and said substrate have purposely different thermal expansion coefficients; and
- said mechanism includes a temperature control element thermally coupled to said substrate in the vicinity of said grating.

19. The tunable laser array of claim 11 wherein, for at least one of said assemblies:
- said at least one property is refractive index of said waveguide in the vicinity of said grating;
- at least a portion of said waveguide in the region of said grating is formed of an electro-optic material; and
- said mechanism includes a voltage source and electrodes disposed so as to generate an electric field in said electro-optic material and thus change the refractive index of said waveguide in the vicinity of said grating.

20. The tunable laser array of claim 11 wherein, for at least one of said assemblies:
- said at least one property is refractive index of said waveguide in the vicinity of said grating; and
- said mechanism includes an acoustic actuator acoustically coupled to said waveguide in the vicinity of said grating.

21. The tunable laser array of claim 20 wherein said acoustic actuator comprises:
- a body of acousto-electric material surrounding said waveguide in the vicinity of said grating; and
- a voltage generator and electrodes disposed so as to subject said body of acousto-electric material to an electric field so as to generate an acoustic standing wave with a node proximate said grating.

22. The tunable laser array of claim 11 wherein, for at least one of said assemblies:
- said laser device is a semiconductor device having an emitting facet; and
- said waveguide is an optical fiber formed with a conical end spaced from said emitting facet.

23. The tunable laser array of claim 11 wherein, for at least one of said assemblies:
- said laser device is a semiconductor device having an emitting facet; and
- said waveguide is a planar waveguide in optical contact with said emitting facet.

24. The tunable laser array of claim 23 wherein said laser device is an expanded beam device.

* * * * *